United States Patent
Sambi et al.

(10) Patent No.: US 9,911,869 B2
(45) Date of Patent: Mar. 6, 2018

(54) DIODE WITH REDUCED RECOVERY TIME FOR APPLICATIONS SUBJECT TO THE CURRENT RECIRCULATION PHENOMENON AND/OR TO FAST VOLTAGE VARIATIONS

(71) Applicant: STMICROELECTRONICS S.R.L., Agrate Brianza (IT)

(72) Inventors: Marco Sambi, Cornaredo (IT); Dario Ripamonti, Monza (IT); Davide Ugo Ghisu, Milan (IT); Dario Bianchi, Suzzara (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 15/250,645

(22) Filed: Aug. 29, 2016

(65) Prior Publication Data
US 2017/0263784 A1    Sep. 14, 2017

(30) Foreign Application Priority Data
Mar. 10, 2016    (IT) .................. 102016000025250

(51) Int. Cl.
*H01L 29/861* (2006.01)
*H01L 29/06* (2006.01)
*H01L 27/06* (2006.01)

(52) U.S. Cl.
CPC ........ *H01L 29/861* (2013.01); *H01L 27/0629* (2013.01); *H01L 29/0649* (2013.01); *H01L 29/0692* (2013.01)

(58) Field of Classification Search
CPC . H01L 29/861; H01L 29/8611; H01L 29/864; H01L 27/0629
See application file for complete search history.

(56) References Cited

U.S. PATENT DOCUMENTS 5,294,825 A * 3/1994 Nakagawa .............. H01L 21/74
257/487
2005/0282375 A1 12/2005 Nitta et al.
(Continued)

OTHER PUBLICATIONS

Allard et at., "On the Role of the N—N⁺ Junction Doping Profile of a PIN Diode on Its Turn-Off Transient Behavior," *IEEE Transactions on Power Electronics* 23(1): 491-494, 2008.
(Continued)

*Primary Examiner* — Tucker J Wright
(74) *Attorney, Agent, or Firm* — Seed IP Law Group LLP

(57) ABSTRACT

A diode comprising a semiconductor body delimited by a front surface and including: a first semiconductor region having a first type of conductivity, facing at least in part the front surface; and a second semiconductor region having a second type of conductivity, the second semiconductor region facing at least in part the front surface and surrounding, at a distance, at least part of the first semiconductor region. The diode further includes: a trench, which extends in the semiconductor body starting from the front surface, for surrounding at least part of the second semiconductor region; and a lateral insulation region, which is arranged within the trench, is formed by dielectric material and contacts at least in part the second semiconductor region.

14 Claims, 4 Drawing Sheets

(56) References Cited

U.S. PATENT DOCUMENTS

2010/0001790 A1\* 1/2010 Hashimoto ......... H01L 27/0629
                                                    327/566
2013/0075877 A1 3/2013 Sakai et al.

OTHER PUBLICATIONS

Benda et al., "Reverse Recovery Processes in Silicon Power Rectifiers," *Proceedings of the IEEE* 55(8): 1331-1354, 1967.

Domeji et al., "On the Destruction Limit of Si Power Diodes During Reverse Recovery with Dynamic Avalanche," *IEEE Transactions on Electron Devices* 50(2): 486-493, 2003.

Egawa, "Avalanche Characteristics and Failure Mechanism of High Voltage Diodes," *IEEE Transactions on Electron Devices* 13(11): 754-758, 1966.

Hower et al., "Reverse-Recovery Safe Operating Area of Diodes in Power Integrated Circuits, " *Proceedings of the 2012 24$^{th}$ International Symposium on Power Semiconductor Devices and ICs*, Jun. 3-7, 2012—Bruges, Belgium pp. 65-68, 2012.

\* cited by examiner

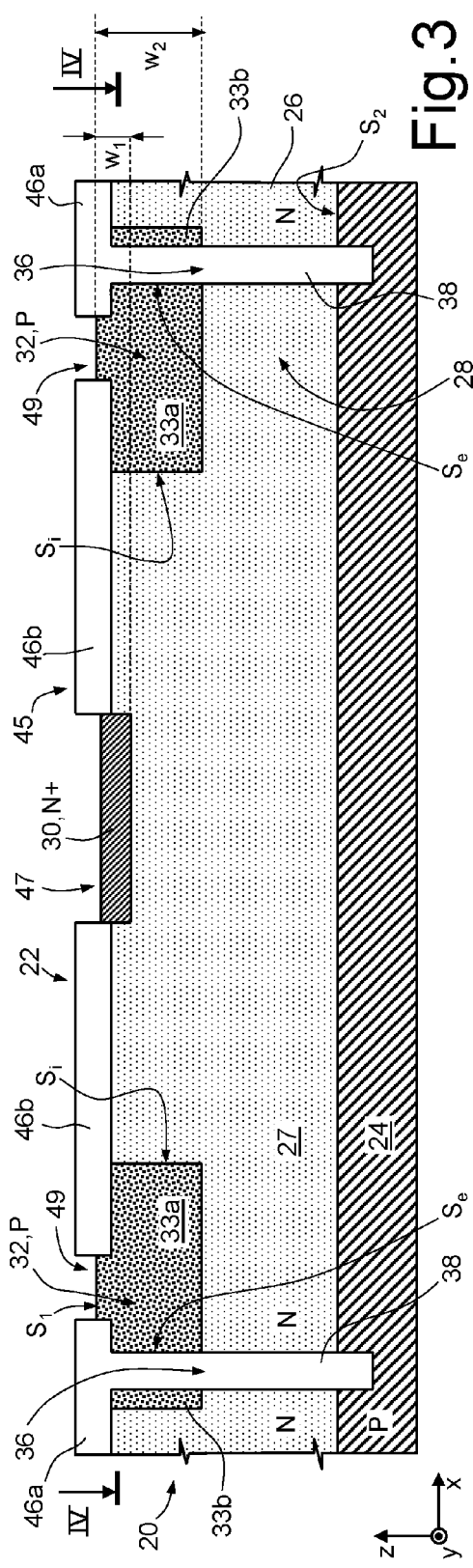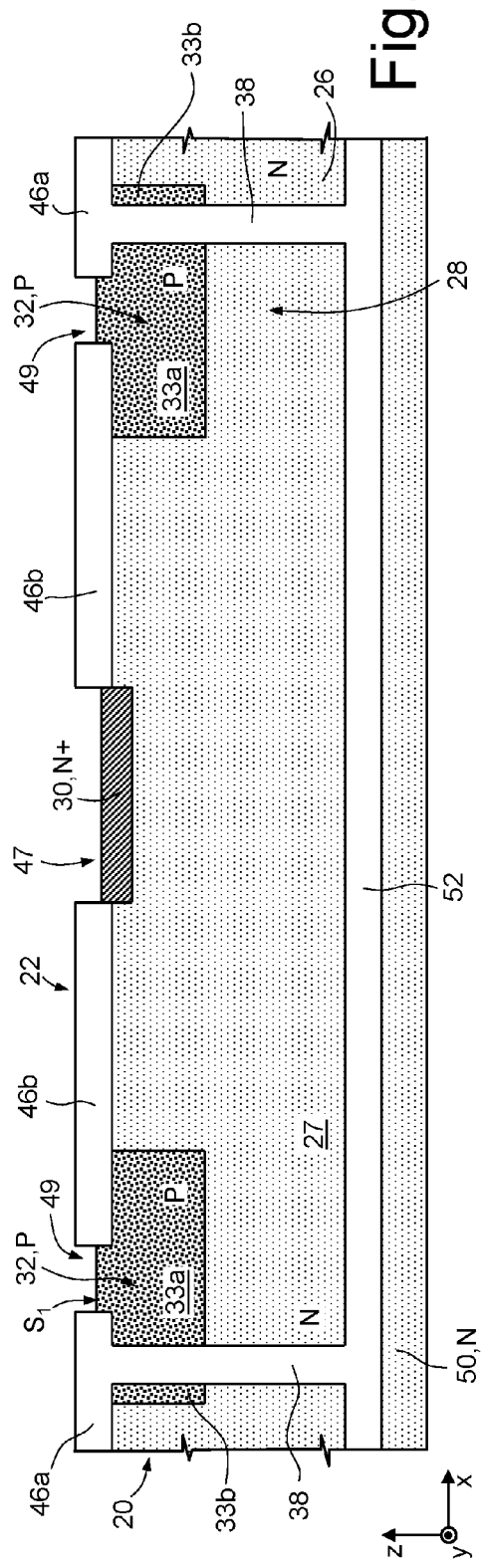

DIODE WITH REDUCED RECOVERY TIME FOR APPLICATIONS SUBJECT TO THE CURRENT RECIRCULATION PHENOMENON AND/OR TO FAST VOLTAGE VARIATIONS

BACKGROUND

Technical Field

The present disclosure relates to a diode with reduced recovery time. In particular, the present diode is suited to being used, for example, in the case of applications potentially subject to the so-called current recirculation phenomenon. More in general, the present diode is suited to being used in the case of applications that envisage subjecting the diode to fast voltage variations.

Description of the Related Art

As is known, the so-called current recirculation phenomenon presents, for example, when an output electronic stage is connected to a (desired or parasitic) inductive load.

For instance, FIG. 1 shows a control stage 2, which includes a first transistor 4 and a second transistor 6, as well as a first diode D1, a second diode D2, a third diode D3, a fourth diode D4, a fifth diode D5, and a sixth diode D6.

In detail, the first transistor 4 is a power MOSFET of a PMOS type and includes the fifth diode D5. The cathode and the anode of the fifth diode D5 are connected to the source terminal and to the drain terminal, respectively, of the first transistor 4.

Furthermore, the source terminal of the first transistor 4 is set at a first (positive) supply voltage $V_+$, whereas the drain terminal is connected to the anode of the third diode D3, the cathode of which forms a node N.

The second transistor 6 is a power MOSFET of an NMOS type and includes the sixth diode D6. The cathode and the anode of the sixth diode D6 are connected to the drain terminal and to the source terminal, respectively, of the second transistor 6.

Furthermore, the source terminal of the second transistor 6 is set at a second (negative or zero) supply voltage $V_-$, whereas the drain terminal is connected to the cathode of the fourth diode D4, the anode of which is connected to the node N.

The anode and the cathode of the first diode D1 are connected to the node N and to the source terminal of the first transistor 4, respectively. Further, the cathode and the anode of the second diode D2 are connected to the node N and to the source terminal of the second transistor 6, respectively.

The node N is electrically connected, for example, to a metal pad 10. In this connection, the third and fourth diodes D3 and D4 serve to prevent, in the case where the first transistor 4 and/or the second transistor 6 are off, a possible signal coming, through the metal pad 10, from the outside world, from traversing the fifth and sixth diodes D5, D6.

Once again as regards the metal pad 10, it is electrically connected to a load formed by a series circuit, which in turn includes an inductor L and a resistor R.

In use, the first and second transistors 4, 6 are controlled, through the respective gate terminals, so as never to be simultaneously in conduction. This having been said, assuming that the first transistor 4 is in conduction, current does not flow in the first diode D1. Further, the second diode D2 sustains the voltage present between the voltage on the node N and the voltage $V_-$, but no current flows in it either. In these conditions, a certain current flows in the load, and thus in the inductor L and in the resistor R.

Then, while the second transistor 6 remains off, the first transistor 4 is off. In these conditions, the inductor L tends to maintain the current that traversed it when the first transistor 4 was on. This current is, however, delivered now by the second diode D2, for a certain period of time. Next, the second transistor 6 is turned on and brings the voltage of the node N to a value approximately equal to V. The current continues to flow in the second diode D2 until the inductor L has exhausted the energy accumulated during the previous conduction step. Once said energy is exhausted, the inductor L is traversed by a current having an opposite direction with respect to the previous conduction step, this current further flowing through the fourth diode D4 and the second transistor 6; in these conditions, the second diode D2 starts to turn off.

This having been said, if before the second diode D2 is completely off (i.e., it is without accumulated charge), the second transistor 6 is turned off and then the first transistor 4 is turned back on, the voltage on the node N rises. In other words, the first transistor 4 tends to force the second diode D2 to operate in reverse mode. However, the second diode D2 is not yet off and must in any case sustain the voltage present on the node N; in these conditions, the second diode D2 may be subject to failure since the voltage across the second diode D2 may be sustained only by the portions of the second diode D2 that are without carriers.

A qualitative example of the plot of the current in the second diode D2 is illustrated in FIG. 2, where V denotes the voltage on the node N, which at a first instant $t_1$ switches from a value approximately equal to $V_+$ to a value approximately equal to $V_-$, and at a subsequent second instant $t_2$ switches from the value approximately equal to $V_-$ to the value approximately equal to $V_+$. Furthermore, FIG. 2 also shows the plot of the current (designated by I) that flows in the second diode $D_2$, on the hypothesis that, at an instant $t_0$ prior to the first instant $t_1$, the first transistor 4 is turned off, and that at said instant $t_0$ the current I is equal to a value $I_D$. This having been said, between the instant $t_0$ and the second instant $t_2$, the current I decreases; however, at the second instant $t_2$, i.e., at the instant when, after the second transistor 6 has been turned off, the first transistor 4 is turned back on, the current I is not completely zero, or in any case (case not illustrated) the second diode D2 is not completely depleted; i.e., it is not completely off. For this reason, following upon the second instant $t_2$, the current I decreases sharply, on account of the charge still stored in the second diode $D_2$, until it reverses its direction. In particular, at a third instant $t_3$, the second diode $D_2$ is traversed by a reverse current equal to $I_R$, which then vanishes at a fourth instant $t_4$ (the exhaustion curve is illustrated in FIG. 2 in a particularly simplified way, for the sole purpose of facilitating understanding). In practice, it may be noted that between the second instant $t_2$ and the third instant $t_3$ failure of the second diode D2 may occur. Similar considerations apply, more in general, also in the case where a so-called current recirculation does not occur, but a diode that is not completely off is in any case subject to sudden voltage changes.

In general, the problem of switching-off of a forward biased diode is strictly correlated with the so-called recovery time, which in turn depends, among other things, upon how the charge is stored within the diode. The longer the recovery time, the higher the likelihood of failure of a diode, when used in applications of the type described above.

This having been said, a treatment of the recovery processes in semiconductor power rectifiers is developed, for example, in "Reverse Recovery Processes in Silicon Power Rectifiers", by H. Benda et al., Proceedings of IEEE, vol. 55, no. 8, August 1967.

In order to reduce the recovery time of a diode, some solutions have been proposed, which prove effective in the case of discrete diodes. In particular, it has been proposed to introduce recombination centers in the semiconductor to accelerate recombination of the excess carriers, i.e., absorption of the charge accumulated during conduction. For this purpose, it is possible to carry out an implantation of ions of heavy metals, or else radiate the semiconductor body with high-power radiation. In this way, the lifetime of the carriers is reduced. These solutions prove particularly advantageous in the case of discrete diodes. However, they are substantially impracticable in the case of multi-component devices integrated in dice, for example with bipolar-CMOS-DMOS (BCD) technology, which, as is known, is a technology (also known as "smart power") that enables integration of CMOS and DMOS transistors in a same bipolar die. In fact, in the case of the implantation of metal ions, the latter tend to spread, contaminating the entire semiconductor wafer. In the case, instead, of high-energy radiation, it leads to an increase in the leakage currents with the device off.

BRIEF SUMMARY

At least one embodiment of the present disclosure is a diode that will overcome at least in part the drawbacks of the known art.

According to at least one embodiment of the present disclosure, a diode includes a semiconductor body having a front surface, a trench which extends in the semiconductor body starting from the front surface, and a lateral insulation region arranged within the trench. The semiconductor body includes a first semiconductor region having a first type of conductivity, facing at least in part the front surface; and a second semiconductor region having a second type of conductivity. The second semiconductor region faces at least in part the front surface and is spaced apart from and positioned on opposite sides of the first semiconductor region. The trench surrounds at least part of the second semiconductor region and the lateral insulation region is a dielectric material that contacts the second semiconductor region.

BRIEF DESCRIPTION OF THE SEVERAL VIEWS OF THE DRAWINGS

For a better understanding of the present disclosure, preferred embodiments thereof are now described, purely by way of non-limiting example and with reference to the attached drawings, wherein:

FIGS. 3 and 6 show schematically cross-sections of embodiments of the present diode;

DETAILED DESCRIPTION

Figure 1:
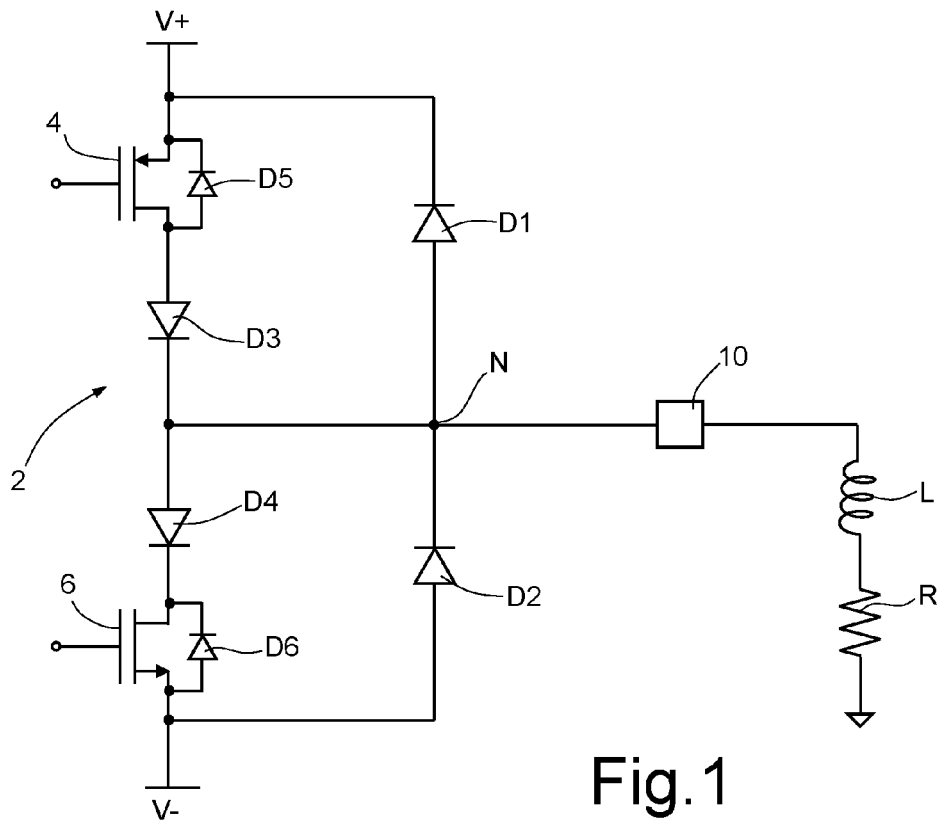
FIG. 1 shows a circuit diagram of a circuit for driving an inductive-resistive load, of a known type.
Figure 2:
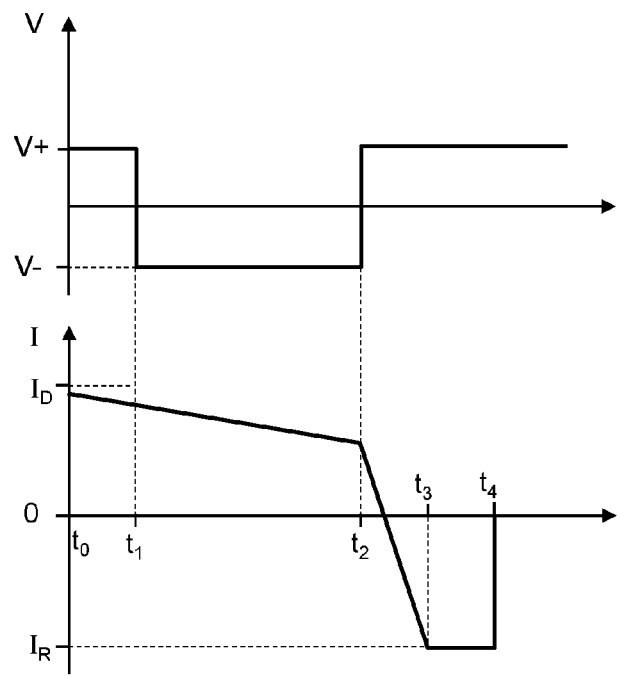
FIG. 2 is a qualitative time plot of a voltage and of a current in the circuit illustrated in FIG. 1.

FIG. 3 shows a portion of a die 20, in which a diode 22 is formed.

In detail, the die 20 comprises a substrate 24 of semiconductor material (for example, silicon) of a P type and a region 26 of semiconductor material (for example, silicon) of an N type, which is referred to in what follows as the top die region 26. The top die region 26 is delimited at the top and at the bottom by a first surface $S_1$ and a second surface $S_2$, respectively. Further, the second surface $S_2$ contacts the substrate 24. In practice, the substrate 24 and the top die region 26 form a body 28, which is made of semiconductor material (for example, silicon) and is delimited at the top by the first surface $S_1$. For instance, the top die region 26 may be an epitaxial region.

The semiconductor body 28 further comprises a region 30 of an N+ type (i.e., with a doping level higher than the doping level of the top die region 26), which will be referred to in what follows as the internal region 30 and extends within the top die region 26, starting from the first surface $S_1$; further, the internal region 30 has a thickness $w_1$. Without any loss of generality, in top plan view (see FIG. 4) the internal region 30 has approximately the shape of a rectangle, the short sides of which are replaced by corresponding semi-circumferences which are the same as and specular to one another. In particular, assuming an orthogonal reference system xyz, in which the axis z is perpendicular to the first surface $S_1$, the long sides of the aforementioned rectangle are parallel to the axis y, whereas the semi-circumferences are arranged specularly with respect to an axis parallel to the axis x. Furthermore, once again to a first approximation, and without any loss of generality, the shape of the internal region 30 may be assumed as invariant with respect to translations parallel to the axis z.

The semiconductor body 28 further comprises a region 32 of a P type, referred to in what follows as the peripheral region 32. As illustrated in FIG. 3, the peripheral region 32 extends within the top die region 26, starting from the first surface $S_1$. Further, without any loss of generality, the peripheral region 32 has a thickness $w_2 > w_1$.

In greater detail, the peripheral region 32 has an annular shape and surrounds the internal region 30 at a distance.

Once again without any loss of generality, in top plan view (see FIG. 4) the peripheral region 32 has a shape that includes a first portion of annulus and a second portion of annulus, which are substantially the same as one another and are arranged specularly with respect to an axis parallel to the axis x. Each of the first and second portions of annulus subtends an angle of 180°. Furthermore, in top plan view, each end of the first portion of annulus is joined to a corresponding end of the second portion of annulus through a corresponding rectangle.

The diode 22 further comprises a trench 36, which extends through the peripheral region 32 and through an underlying portion of the top die region 26, until it penetrates in part into the substrate 24. The trench 36 has an annular shape and is completely filled by a lateral insulation region 38, formed by dielectric material (for example, silicon oxide, whether thermal and/or deposited). In practice, the trench 36 delimits the active area of the diode 22.

More in particular, the trench 36 extends for dividing the peripheral region 32 into an inner portion 33a and an outer portion 33b, which are physically separated from one another, on account of interposition of the lateral insulation region 38. As illustrated in greater detail in FIG. 4, the inner portion 33a of the peripheral region 32 includes a first portion 40a and a second portion 40b. To a first approximation, the first and second portions 40a, 40b are the same, are parallelepipedal, and are arranged on opposite sides with respect to the internal region 30. Without any loss of generality, in top plan view, the first and second portions 40a, 40b of the inner portion 33a of the peripheral region 32 have approximately a rectangular shape, the long sides of which are parallel to the axis y. Furthermore, once again without any loss of generality, the inner portion 33a of the peripheral region 32 includes a third portion 40c and a fourth portion 40d (in FIG. 4, to facilitate understanding, the first, second, third, and fourth portions 40a-40d are separated by imaginary dashed lines). Furthermore, in top plan view, the third and fourth portions 40c, 40d have, respectively, the shape of a third portion of annulus and a fourth portion of annulus that are substantially the same and are arranged specularly with respect to an axis parallel to the axis x. Each of the third and fourth portions of annulus subtends an angle of 180°.

To a first approximation, and without any loss of generality, it may be assumed that also the inner portion 33a of the peripheral region 32 has a shape substantially invariant with respect to translations parallel to the axis z. Furthermore, a first end of the third portion 40c of the inner portion 33a of the peripheral region 32 is joined to a first end of the fourth portion 40d of the inner portion 33a of the peripheral region 32 through the first portion 40a. Likewise, a second end of the third portion 40c is joined to a second end of the fourth portion 40d through the second portion 40b of the inner portion 33a of the peripheral region 32.

In greater detail, the inner portion 33a of the peripheral region 32 is delimited laterally by an inner surface $S_i$, which contacts a portion (designated by 27) of the top die region 26 surrounded by the lateral insulation region 38, and by an outer surface $S_e$, which contacts the lateral insulation region 38. In particular, a top portion of the lateral insulation region 38 is in contact with the inner portion 33a of the peripheral region 32 (i.e., it is coated by the latter), whereas a bottom portion contacts the aforementioned portion 27 of the top die region 26.

Again with reference to FIG. 3, the diode 22 further comprises a top dielectric region 45 (not visible in FIG. 4), which is made precisely of dielectric material (for example, thermal oxide).

The top dielectric region 45 is patterned for forming a first window 47 and a second window 49, respectively, which enable a portion of the internal region 30 and a part of the inner portion 33a of the peripheral region 32, respectively, to be left exposed in order to be able to guarantee electrical contact thereof through appropriate metallizations (not shown).

Without any loss of generality, in the embodiment illustrated in FIG. 3, the top dielectric region 45 comprises a portion (designated by 46a), which has an annular shape and overlies the lateral insulation region 38, in direct contact therewith. Furthermore, the top dielectric region 45 comprises a further portion 46b, referred to in what follows as the field dielectric region 46b, which has an annular shape and surrounds the internal region 30 until it overlies a portion facing the internal region 30 of the inner portion 33a of the peripheral region 32. The field dielectric region 46b is thus surrounded, at a distance, by the portion 46a of the top dielectric region 45. Further, the field dielectric region 46b defines the first window 47 and, together with the portion 46 of the top dielectric region 45 that overlies the lateral insulation region 38, the second window 49.

Once again with reference to the embodiment illustrated in FIG. 3, purely by way of example the top dielectric region 45 is arranged in part on top of and in part underneath the first surface $S_1$, even though embodiments (not shown) are in any case possible in which the top dielectric region 45 entirely overlies the first surface $S_1$ (for example, in direct contact with the latter) or entirely underlies the first surface $S_1$. These considerations regarding mutual arrangement of the top dielectric region 45 and the first surface $S_1$ apply in general to all the embodiments described herein.

Without any loss of generality, it may further be assumed that the second window 49 (and thus also the underlying exposed part of the inner portion 33a of the peripheral region 32) has an approximately constant width along its own perimeter. Furthermore, purely by way of example, and to a first approximation, it may likewise be assumed that the field dielectric region 46b has an approximately constant width along its own perimeter. Once again by way of example, and to a first approximation, it may be assumed that the internal region 30 is approximately equidistant from the first and second portions 40a, 40b of the inner portion 33a of the peripheral region 32. Once again by way of example and without any loss of generality, it may be assumed, to a first approximation, that a first part of the portion 27 of the top die region 26, which is arranged between the third portion 40c of the inner portion 33a of the peripheral region 32 and the internal region 30, has in top plan view the shape of a fifth portion of annulus. Likewise, to a first approximation, it may be assumed that a second part of the portion 27 of the top die region 26, which is arranged between the fourth portion 40d of the inner portion 33a of the peripheral region 32 and the internal region 30, has in top plan view the shape of a sixth portion of annulus, which may be approximately the same as and specular to the fifth portion of annulus.

Irrespective of the details of implementation, the diode 22 comprises an anode region, formed by the inner portion 33a of the peripheral region 32, and a cathode region, formed by the internal region 30, which functions as enriched cathode region, and by the portion 27 of the top die region 26, which is surrounded by the lateral insulation region 38. Further, the trench 36 guarantees an electrical insulation of a dielectric type, also known as deep trench insulation (DTI). Consequently, the outer portion 33b of the peripheral region 32 and the portions of the top die region 26 located outside the trench 36 are electrically insulated from the aforementioned anode and cathode regions. As regards the portions of the top die region 26 located outside the trench 36, these may house further electronic components (not shown).

Thanks to the arrangement of the anode region, of the cathode region, and of the lateral insulation region 38, in the proximity of the lateral insulation region 38 there are not present significant portions of semiconductor aimed merely at increasing insulation, said portions representing regions in which the charge may accumulate, the time required for depleting the accumulated charge being further particularly long. The diode 22 is thus characterized by a shorter recovery time, as illustrated in FIG. 5.

Figure 5:
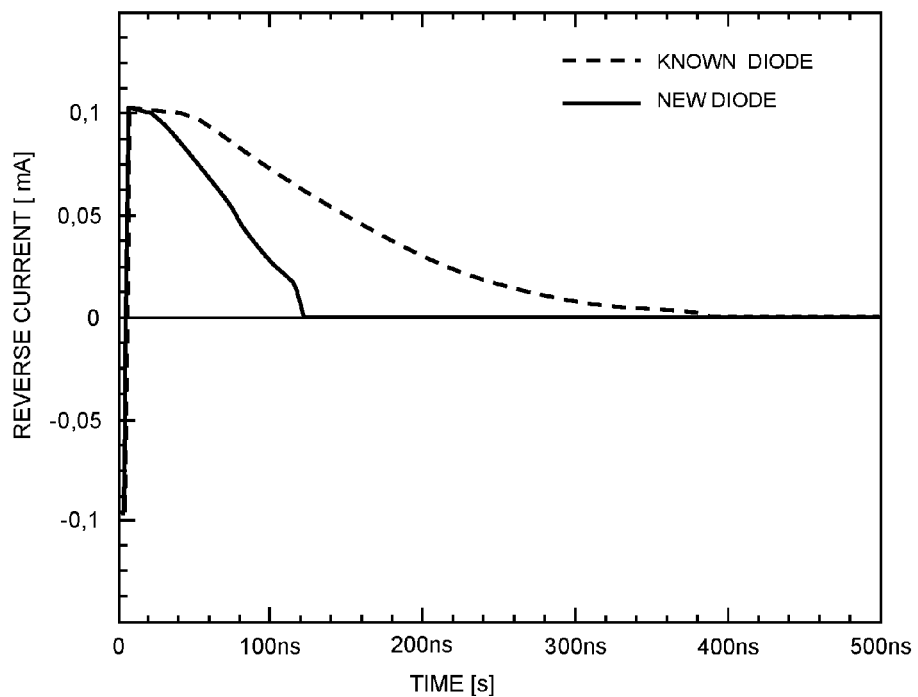
FIG. 5 shows time plots, obtained via simulation, of reverse currents that flow in a diode of a traditional type (dashed curve) and in an embodiment of the present diode (solid curve).

In detail, FIG. 5 shows simulations of time plots of the reverse current, respectively in a diode of a traditional type and in an embodiment of the present diode, when a reverse voltage is applied to these diodes before they are completely turned off This having been said, FIG. 5 shows the advantage that may be achieved with the present diode, the accumulated charge of which (approximately equal to the area subtended by the positive portion of the respective current curve) is less than in the case of the traditional diode.

Figure 4:
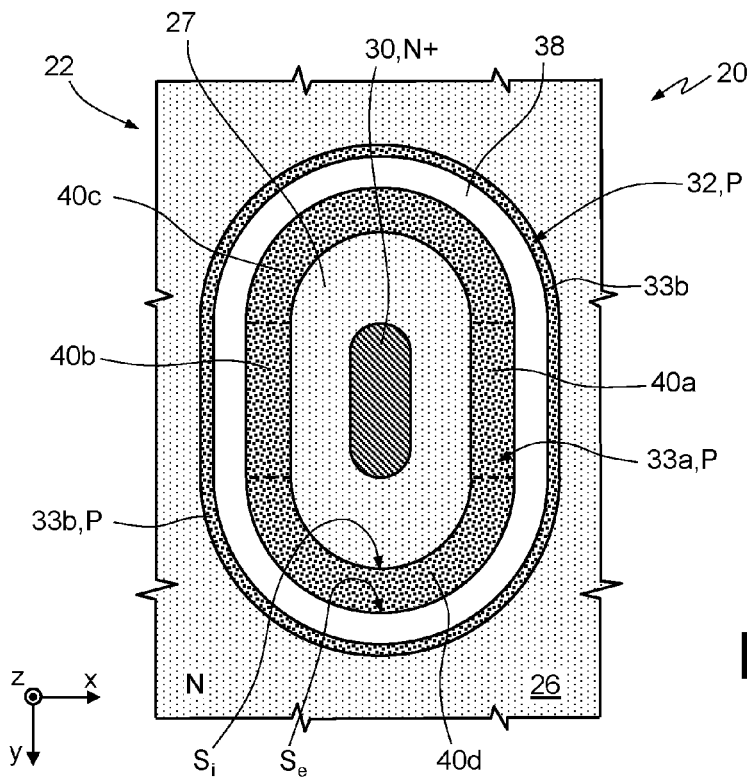
FIG. 4 shows a cross-section of the diode illustrated in FIG. 3, taken along a line of section IV-IV represented in FIG. 3.

FIG. 6 shows a different embodiment, which is described in what follows limitedly to the differences with respect to the embodiment illustrated in FIGS. 3 and 4, except where otherwise specified. Furthermore, elements and regions that are already present in the embodiment illustrated in FIGS. 3 and 4 are referred to by the same terms and designated by the same notation, except where otherwise specified.

In detail, the substrate 24 is replaced by a region 50 of semiconductor material (for example, silicon) of an N type, referred to in what follows as the bottom die region 50. In addition, arranged between the bottom die region 50 and the top die region 26 is a buried region 52 of dielectric material (for example, silicon oxide), which thus contacts both the bottom die region 50 and the top die region 26. Furthermore, the trench 36 extends as far as the buried region 52 so that the lateral insulation region 38 contacts the buried region 52, which functions as bottom insulation region.

In practice, also the embodiment illustrated in FIG. 6 enables the diode 22 to store less charge than traditional diodes, and further to store said charge in regions that may be depleted more rapidly, with consequent reduction in the recovery time. This is due to the fact that the anode region extends in contact with the trench 36 and surrounds the cathode region; consequently, the diode is without peripheral semiconductor regions that perform only a function of insulation, also known as "spare silicon regions". It may further be shown that the embodiments described are characterized by a high dynamic breakdown voltage (BV).

Even though they are not shown, embodiments are further possible in which a further trench is present, referred to in what follows as the additional trench, which surrounds, at a distance, the trench 36 and houses an additional lateral insulation region. In this case, between the lateral insulation region 38 and the additional lateral insulation region a non-active semiconductor region is present, i.e., one electrically separated from the anode region, from the cathode region of the diode 22, and from the outer portion 33b of the peripheral region 32. If the internal region 30 and the inner portion 33a of the peripheral region 32 are referred to voltages different from the ground of the device as a whole integrated in the die 20, the non-active semiconductor region may be shorted with the inner portion 33a of the peripheral region 32 for eliminating lateral voltage drops between the inner portion 33a and the outer portion 33b of the peripheral region 32. In any case, accumulation of charge may not occur in the non-active semiconductor region.

From what has been described and illustrated previously, the advantages that the present solution affords emerge clearly.

In particular, the present diode, starting from a condition in which it operates in a forward-biasing region, may be turned off in short periods of time since it minimizes the charge stored during the conduction step. Furthermore, the present diode may be implemented with a technology of the so-called BCD type; i.e., it does not require additional steps as compared to a traditional BCD process. In addition, the present diode is characterized by small dimensions, and thus does not involve any increase in production costs or any increase in parasitic capacitances.

In conclusion, it is clear that modifications and variations may be made to what has been described and illustrated herein, without thereby departing from the scope of the present disclosure.

For instance, the shapes of the internal region 30 and of the peripheral region 32, and in particular of the inner portion 33a of the latter, may be different from what has been described. More in particular, one or more from among the internal region 30, the lateral insulation region 38, the inner portion 33a, and the outer portion 33b of the peripheral region 32 may have, in top plan view, the shape of a rectangle with rounded vertices.

Likewise, also the shapes of the lateral insulation region 38 and of the top dielectric region 45 may be different from what has been described, as also the corresponding materials. On the other hand, the lateral insulation region 38 may even be only partial; i.e., it may form just one or more portions (possibly, separate from one another) having an annular shape.

It is further possible for the anode region, i.e., the inner portion 33a of the peripheral region 32, not to be monolithic; that is, it may comprise a number of subportions physically separated from one another, in which case the internal region 30 may not be entirely surrounded by the anode region. Further, in this case, just one part of the top portion of the lateral insulation region 38 is in contact with subportions of the inner portion 33a of the peripheral region 32. Likewise, the internal region 30 may not be monolithic either.

The types of doping may also be reversed with respect to what has been described.

Figure 7:
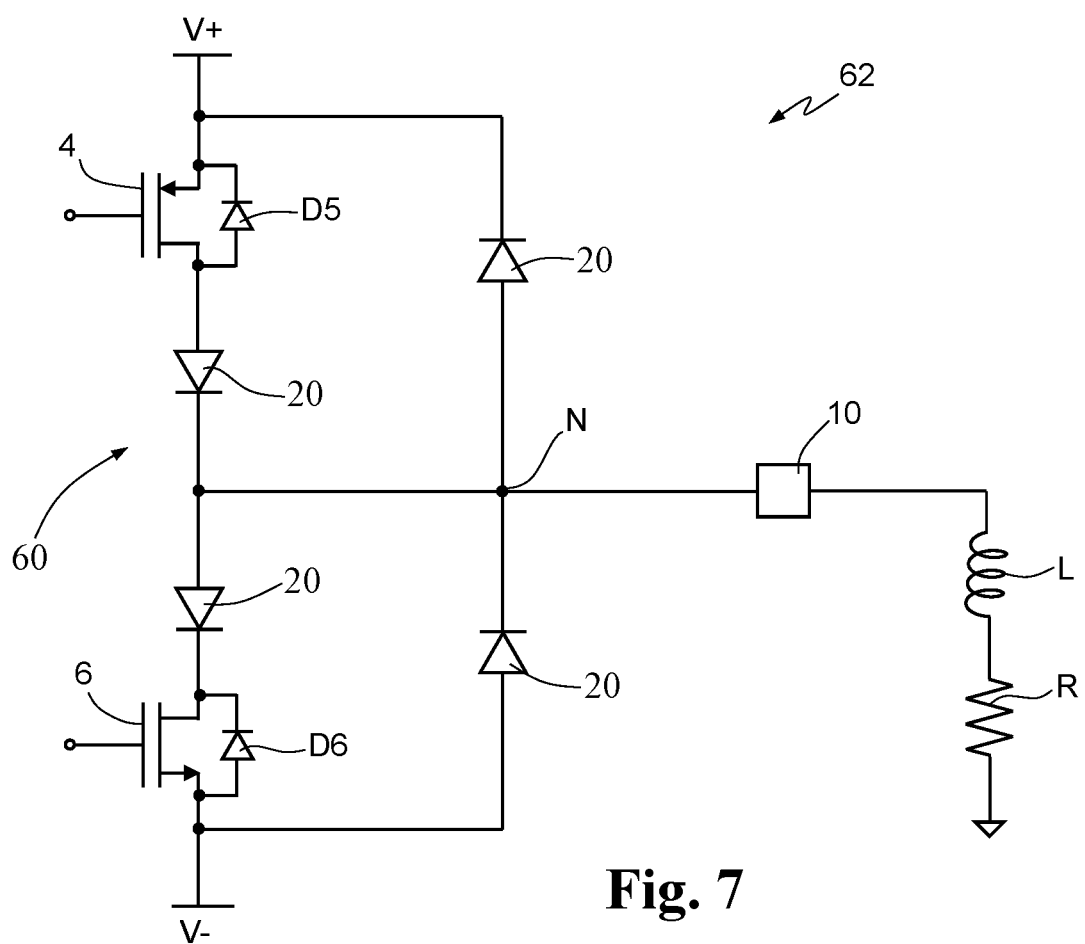
FIG. 7 shows a circuit diagram of a circuit for driving an inductive-resistive load according the one embodiment of the present application.

The diode 22 according to the various embodiments discussed herein may be used to implement any of the diodes D1-D4 of the control stage 2 of the output circuit depicted in FIG. 1 in order to produce a control stage 60 and output circuit 62 according to some embodiments of the present disclosure, as shown in FIG. 7.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A diode comprising:
a semiconductor body having a front surface, said semiconductor body including:
   a first semiconductor region having a first type of conductivity, facing at least in part the front surface; and
   a second semiconductor region having a second type of conductivity, said second semiconductor region facing at least in part the front surface and being spaced apart from and positioned on opposite sides of the first semiconductor region;
a trench which extends in the semiconductor body starting from the front surface and surrounds at least part of the second semiconductor region; and
a lateral insulation region arranged within the trench, said lateral insulation region being formed by dielectric material and contacting at least in part the second semiconductor region, wherein:
said semiconductor body comprises a third semiconductor region which has a conductivity of the first type and has a doping level lower than a doping level of the first semiconductor region; and wherein a top portion of the lateral insulation region is coated laterally by the second semiconductor region, a bottom portion of the lateral insulation region being arranged in contact with said third semiconductor region;

said semiconductor body further comprises a substrate having the second type of conductivity, the substrate being arranged in contact with said third semiconductor region; and the trench penetrates in part into the substrate.

2. The diode according to claim 1, wherein the second semiconductor region has an annular shape and laterally entirely surrounds the first semiconductor region; and wherein the lateral insulation region has an annular shape and laterally entirely surrounds said second semiconductor region.

3. The diode according to claim 2, wherein said second semiconductor region has a lateral outer surface which contacts the lateral insulation region.

4. The diode according to claim 1, wherein said semiconductor body further comprises a fourth semiconductor region having the first type of conductivity; said diode further comprising a buried dielectric region arranged between the third and fourth semiconductor regions; and wherein said lateral insulation region contacts the buried dielectric region.

5. The diode according to claim 1, wherein said first type of conductivity is a conductivity of an N type, said second type of conductivity is a conductivity of a P type, and said first and second semiconductor regions form respectively a cathode region and an anode region.

6. A control stage for controlling an inductive load, the control stage comprising:
a plurality of transistors configured to control the inductive load; and
a diode electrically coupled to the transistors, the diode including:
a semiconductor body having a front surface, said semiconductor body including:
a first semiconductor region having a first type of conductivity, facing at least in part the front surface; and
a second semiconductor region having a second type of conductivity, said second semiconductor region facing at least in part the front surface and being spaced apart from and positioned on opposite sides of the first semiconductor region;
a trench which extends in the semiconductor body starting from the front surface and surrounds at least part of the second semiconductor region; and
a lateral insulation region arranged within the trench, said lateral insulation region being formed by dielectric material and contacting at least in part the second semiconductor region, wherein:
said semiconductor body comprises a third semiconductor region which has a conductivity of the first type and has a doping level lower than a doping level of the first semiconductor region; and wherein a top portion of the lateral insulation region is coated laterally by the second semiconductor region, a bottom portion of the lateral insulation region being arranged in contact with said third semiconductor region;
said semiconductor body further comprises a substrate having the second type of conductivity, the substrate being arranged in contact with said third semiconductor region; and
the trench penetrates in part into the substrate.

7. The control stage according to claim 6, wherein said second semiconductor region has a lateral outer surface which contacts the lateral insulation region.

8. The control stage according to claim 6, wherein the second semiconductor region has an annular shape and laterally entirely surrounds the first semiconductor region; and wherein the lateral insulation region has an annular shape and laterally entirely surrounds said second semiconductor region.

9. The control stage according to claim 6, wherein said semiconductor body further comprises a fourth semiconductor region having the first type of conductivity; said diode further comprising a buried dielectric region arranged between the third and fourth semiconductor regions; and wherein said lateral insulation region contacts the buried dielectric region.

10. An output stage, comprising:
an inductor;
a control stage configured to control current flow in the inductor, the control stage including:
a plurality of transistors configured to control the inductor; and
a diode electrically coupled to the transistors, the diode including:
a semiconductor body having a front surface, said semiconductor body including:
a first semiconductor region having a first type of conductivity, facing at least in part the front surface; and
a second semiconductor region having a second type of conductivity, said second semiconductor region facing at least in part the front surface and being spaced apart from and positioned on opposite sides of the first semiconductor region;
a trench which extends in the semiconductor body starting from the front surface and surrounds at least part of the second semiconductor region; and
a lateral insulation region arranged within the trench, said lateral insulation region being formed by dielectric material and contacting at least in part the second semiconductor region, wherein:
said semiconductor body comprises a third semiconductor region which has a conductivity of the first type and has a doping level lower than a doping level of the first semiconductor region; and wherein a top portion of the lateral insulation region is coated laterally by the second semiconductor region, a bottom portion of the lateral insulation region being arranged in contact with said third semiconductor region;
said semiconductor body further comprises a substrate having the second type of conductivity, the substrate being arranged in contact with said third semiconductor region; and
the trench penetrates in part into the substrate.

11. The output stage according to claim 10, wherein said second semiconductor region has a lateral outer surface which contacts the lateral insulation region.

12. The output stage according to claim 10, wherein the second semiconductor region has an annular shape and laterally entirely surrounds the first semiconductor region; and wherein the lateral insulation region has an annular shape and laterally entirely surrounds said second semiconductor region.

13. The output stage according to claim 10, wherein said semiconductor body further comprises a fourth semiconductor region having the first type of conductivity; said diode further comprising a buried dielectric region arranged between the third and fourth semiconductor regions; and wherein said lateral insulation region contacts the buried dielectric region.

14. The output stage according to claim 10, wherein said first type of conductivity is a conductivity of an N type, said second type of conductivity is a conductivity of a P type, and said first and second semiconductor regions form respectively a cathode region and an anode region.

* * * * *